United States Patent [19]

Shin

[11] Patent Number: 5,528,078
[45] Date of Patent: Jun. 18, 1996

[54] FILM CARRIER AND A METHOD FOR MANUFACTURING THE SAME

[75] Inventor: Sang-Cheol Shin, Seoul, Rep. of Korea

[73] Assignee: Samsung Electronics Co., Ltd., Suwon, Rep. of Korea

[21] Appl. No.: 237,359

[22] Filed: May 3, 1994

[30] Foreign Application Priority Data

May 3, 1993 [KR] Rep. of Korea ............... 1993-7570

[51] Int. Cl.$^6$ .................................................. H01L 23/495
[52] U.S. Cl. ..................... 257/676; 257/666; 257/668
[58] Field of Search ................................ 257/666, 668, 257/676

[56] References Cited

U.S. PATENT DOCUMENTS

| | | | |
|---|---|---|---|
| 4,594,493 | 6/1986 | Harrah et al. .................. | 219/56.22 |
| 5,132,772 | 7/1992 | Fetty ............................. | 257/779 |
| 5,153,707 | 10/1992 | Makino et al. ................ | 257/668 |
| 5,248,895 | 9/1993 | Nakazawa ..................... | 257/668 |
| 5,252,855 | 10/1993 | Ogawa et al. ................. | 257/676 |
| 5,311,056 | 5/1994 | Wakabayashi et al. ........ | 257/668 |

*Primary Examiner*—Sara W. Crane
*Attorney, Agent, or Firm*—Cushman Darby & Cushman

[57] ABSTRACT

A film carrier for a semiconductor chip comprises a film having a device hole formed therein for mounting said film carrier to the semiconductor chip, and a plurality of leads. Each lead has an end portion thereof extending into the device hole in the film, and the end portion of the leads include an anodic oxide layer disposed therein and a contact portion for contacting an electrode pad of the semiconductor chip.

11 Claims, 5 Drawing Sheets

FILM CARRIER AND A METHOD FOR MANUFACTURING THE SAME

This application has priority rights based on South Korean application No. 93-7570 filed May 3, 1993, which South Korean application is hereby incorporated by reference.

BACKGROUND OF THE INVENTION

1. Field of the Invention

The present invention relates to a film carrier and a method for manufacturing the same. More particularly, the invention relates to a film carrier and a method that can prevent a short-circuit between inner leads and edge portions of a semiconductor chip by anodizing end portions of the inner leads contacting an electrode pad of the semiconductor chip.

2. Description of the Related Art

In general, semiconductor chips such as integrated circuits (IC) or large scale integrated circuits (LSI) are very thin and small-sized and thus cannot be mounted directly to a printed circuit board (PCB). Accordingly, the semiconductor chips are encapsulated in a molding resin to be mounted in the PCB.

Generally, the basic structure of a semiconductor package is as follows. A semiconductor chip is mounted on a die pad of a lead frame to connect an electrode terminal of the semiconductor chip to leads for connecting an outer circuit by a bonding wire. The semiconductor chip and the bonding wire are sealed together with the lead frame, and a plurality of outer leads are extended from the package.

Such semiconductor packages are mainly divided into a dual in-line package (DIP) having two rows of leads which are bent vertically and downwardly from both sides of the semiconductor package and a quad flat package (QFP) having two rows of staggered pins on each of four sides of the semiconductor package. The QFP has the advantage that it can be more densely mounted on the PCB than the DIP can.

Recently, as electronic appliances of high functionality, small-size and light weight are becoming increasingly popular, semiconductor ships have become highly integrated, and the number of pins are increased correspondingly. Hence, packages made by wire-bonding such as DIPs and QFPs are not satisfactory any more, and a new package is now required.

Therefore, there has been improved a film carrier in which an electrode of a semiconductor chip and corresponding leads are collectively connected to each other, instead of a conventional wirebonding method. This method for manufacturing the film carrier is also known as the tape carrier method, or the tape automated bonding method (TAB).

The film carrier method is a kind of surface-mounting package technique, in which a lead frame and metallic patterns (leads) serving as the conducting wire are formed on a base film, and metallic patterns on the base film are bonded to an electrode pad of the semiconductor chip by bumps formed of metallic protrusions. This film carrier method of an advanced technology is totally different from the bonding-wire method, and is mainly used in a small-sized electric calculator, liquid crystal displays (LCD), computers, etc.

Figure 1:
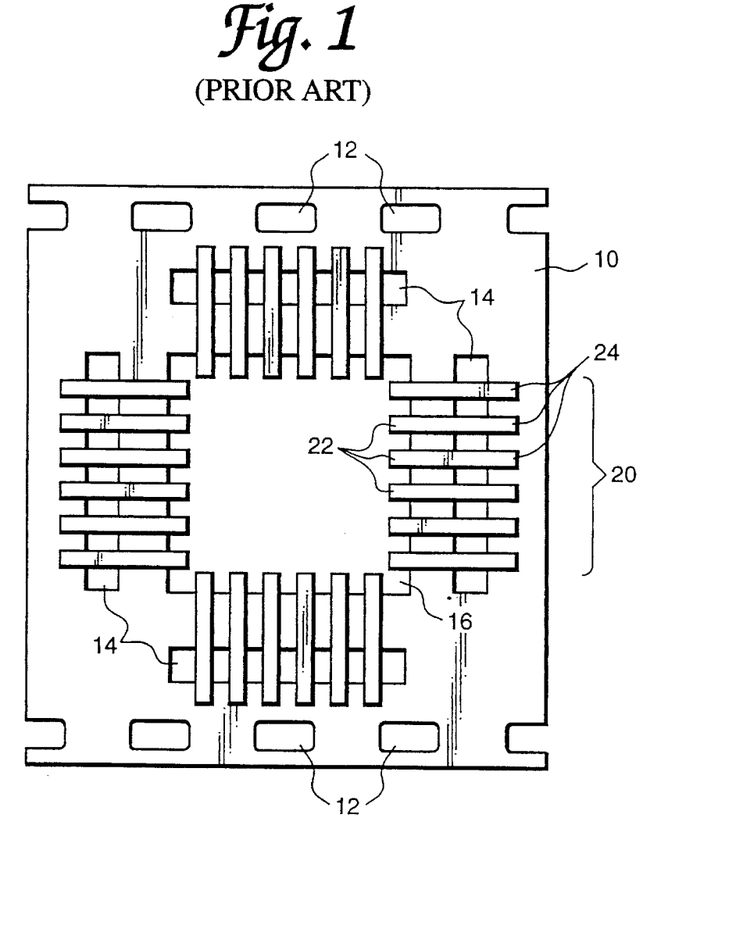
FIG. 1 is a plan view of a film carrier according to a prior art.

FIG. 1 is a plan view of a film carrier used in a TAB package according to the prior art.

Referring to FIG. 1, the conventional film carrier is provided with an insulating film having sprocket apertures 12, inner leads 22 and outer leads 24 formed by photo-etching a copper thin film attached to this insulating film 10. The inner leads 22 and outer leads 24 are generally referred to as leads 20, hereinafter. The insulating film 10 is made of polyester, polyethersulfonate (PES), polyparaanic acid (PPA).

The manufacturing process for making the above film carrier is generally described in detail as follows.

First, the insulating film 10 is punched to form a device hole 16 and outer lead grooves 14, and a thin copper film is deposited on the insulating film to a thickness of 18–35 μm. Subsequently, a photosensitive layer is applied to the thin copper film, exposed to light, and then developed to form a pattern of the photosensitive layer. Thereafter, the exposed area of the thin copper film is etched by using the pattern of the photosensitive layer, which is removed later.

Accordingly, the inner leads 22 and outer leads 24 are formed by patterning of the photosensitive layer. The inner leads 22, which partially extend into the device hole 16 are formed to be straight near the edge of the insulating film 10. Such a film carrier is formed by a series of film carrier units of the same structure, and can be kept together by being wound on a reel. On the film carrier, semiconductor chips are mounted in various ways. That is to say, after an electrode pad of a semiconductor chip is joined to ends of the inner leads 22 by simultaneous multi point bonding (namely gang bonding), the ends of the outer lead 24 are joined to metallized electrodes of the PCB.

Figure 2:
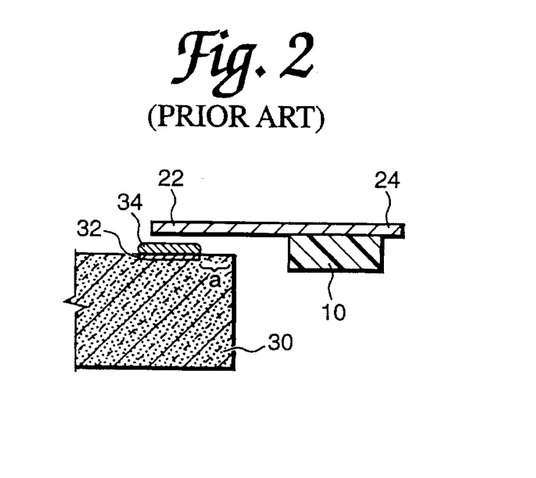
FIG. 2 is a partially-sectional view of an example for bonding an electrode pad of a semiconductor chip and an inner lead to each other mounted in the film carrier of FIG. 1.
Figure 3:
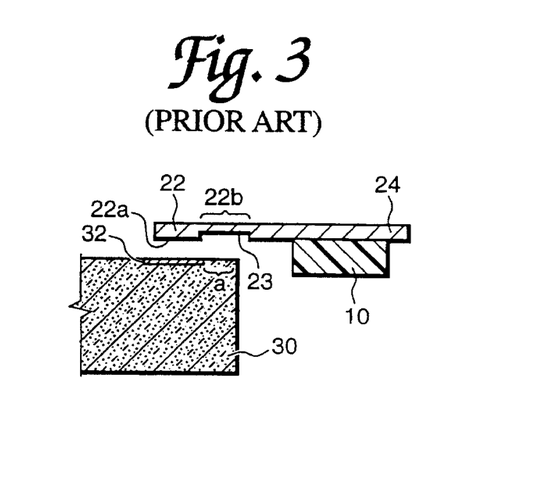
FIG. 3 is a partially-sectional view of another example for bonding an electrode pad of a semiconductor chip and an inner lead to each other mounted in the film carrier of FIG. 1.

FIGS. 2 and 3 are partially sectional views showing a method for bonding an electrode pad of a semiconductor chip and inner leads mounted in the film carrier of FIG. 1.

Referring to FIG. 2, a bump 34 of gold (Au) is formed on the electrode pad 32 of the semiconductor chip 30, and the inner lead 22 corresponding thereto is placed on the bump 34. After that, the electrode pad 32 of the semiconductor chip 30 is joined to the inner lead 22 by the bump 34 spread out by a thermo-compression method.

The bump 34, which is generally formed on the electrode pad 32 of the semiconductor chip 30, can be formed on the inner lead 22 disposed to be corresponding to the electrode pad 32. The PCB or a LCD is coupled to the outer lead 24. Here, reference numeral 10 in FIG. 2 designates an insulating film. Such a technique is disclosed in U.S. Pat. Nos. 4,494,688 and 3,763,404, hereby incorporated by reference.

The bonding technique using the bump as shown in FIG. 2 requires an expensive and precise apparatus due to fine pitch between the electrode pads 32 according to the high integration in the process of forming the bump 34 on the electrode pad 32 of the semiconductor chip 30. Besides this fact, the method has another disadvantage in that the inner lead 22 connected electrically to the electrode pad 32 may be short-circuited at the edge of the semiconductor chip 30, though the inner lead 22 connected to the electrode pad 32 by the bump 34 is off form the surface of the semiconductor chip 30 as munch as the height of the bump 34.

Another bonding technique, which is disclosed in U.S. Pat. No. 4,210,926, hereby incorporated by reference, is a direct bonding technique in which the electrode pad of the semiconductor chip is bonded to the inner lead without the bump, as shown in FIG. 3.

Referring to FIG. 3, the inner lead 22 formed on the insulating film 10 is provided with a contact portion 22a bonded to the electrode pad of the semiconductor chip and an edge portion 23 of a corresponding position to the edge portion 8 of the semiconductor chip.

According to the above bonding technique, the inner lead 22 is placed on the electrode pad 32 of the semiconductor chip 30 to come into contact with the contact portion 22a, and the electrode pad 32 of the semiconductor chip 30 is bonded to the inner lead 22 by a thermo-compression method.

Such a bonding technique has an advantage in that it requires no bump, but it also has a disadvantage in that it requires a precise etching process of edge portion 23 without failure in order to prevent a short-circuit that may occur at the edge portion of the semiconductor chip 30.

In addition, the above bonding technique has another disadvantage in that it cannot exactly etch the end of the finely-pitched inner lead 22 to a suitable thickness, and that the end of the inner lead 22 is degraded by the contact portion 22a which remains thin after the etching process.

SUMMARY OF THE INVENTION

It is an object of the present invention to provide a film carrier (and method for manufacturing the same) that collectively bonds with semiconductor chips without a bump forming process or an etching process on end portions of the inner leads. This is accomplished by forming insulative layers on one-side of end portions of the inner leads which contact the bonding pads of the semiconductor chip.

It is another object of the present invention to provide a film carrier (and a method for manufacturing the same) that enhances adhesive mounting strength of semiconductor chips by collective bonding.

To achieve the above objects of the present invention, a film carrier of the invention comprises a film having a device hole for mounting the carrier to a semiconductor chip, a plurality of leads having an end portion thereof extending into the device hole in said film, a contact portion formed in the leads, and insulative layers formed in the end portion of the leads adjacent the contact portion for contacting the electrode pad of the semiconductor chip. Preferably, the insulative layers are formed from an anodic oxide material during an anodic oxidation manufacturing process.

As a result of the present invention, production costs may be saved since the film carrier of present invention can be formed just by the anodic oxidation process without the conventional solder bump process and the etching process of the end portions of the leads. In addition, the leads may be prevented from being bent during bonding, while, in addition, the device is prevented from being degraded by $\alpha$-rays since anodized portions protect the active regions of the device.

DETAILED DESCRIPTION OF THE PREFERRED EMBODIMENTS

A film carrier and a method for manufacturing the same according to the present invention are now fully described with reference to the accompanying drawings.

Figure 4A:
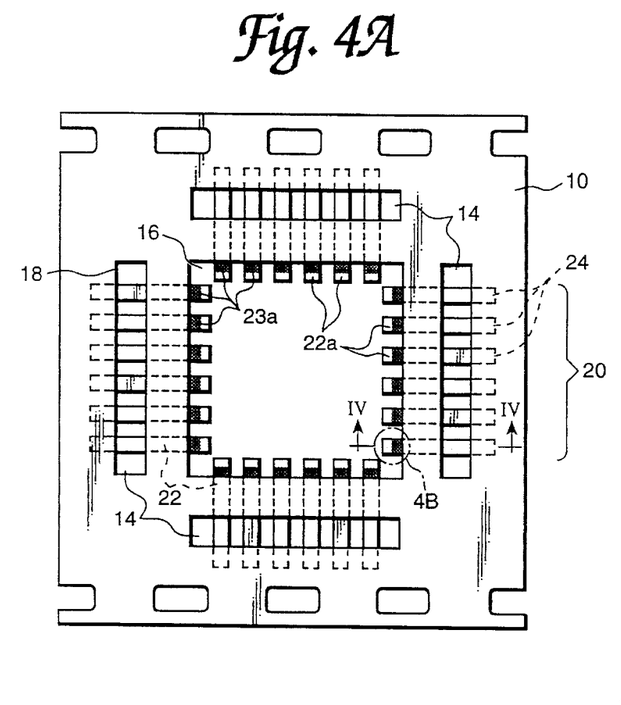
FIG. 4A is a bottom view showing a film carrier according to a first preferred embodiment of this invention.

FIG. 4A is a plan view of a first preferred embodiment of the film carrier of the present invention. The same portions as the conventional film carrier are designated by the same reference numerals throughout the specification, and a detailed description with respect thereto is omitted.

Referring to FIG. 4A, a film carrier of present invention includes an insulating film 10 having sprocket apertures 12, a device hole 16, outer lead grooves 14, and a plurality of leads 20 formed on the upside or lower side of the insulating film 10 to extend partially toward the device hole 16 and cross the outer lead grooves 14.

The insulating film 10 is made of polyimide, polyester, polyethersulfonate (PES) or polyparaanic acid (PPA). The leads may be formed of a anodizable metal, such as aluminum, tantalum, niobium, zirconium or tungsten.

Reference numeral 18 is a trunk lead for connecting electrically a plurality of leads 22 to each other. The trunk leads 18 are used for connecting electrodes at the time of performing the anodic oxidation.

The anodic oxide layers 23a extend partially into device hole 16 and are formed on one end portion of each lead 20 formed across the outer lead grooves 14. The anodic oxide layers 23a of the prior art, as shown in FIG. 3, are formed to correspond etching portions 23 which are formed to prevent the semiconductor chip 30 from coming into contact with edge portions. The anodic oxide layer 23a is more clearly shown in FIG. 4B as an enlarged sectional view as taken along line IV—IV in FIG. 4A.

Figure 4B:
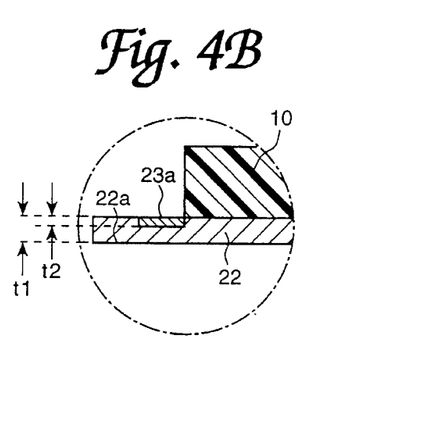
FIG. 4B is a sectional view taken along the line IV—IV in FIG. 4A.

With respect to the sectional shape of the anodic oxide layers 23a formed on the inner leads 22, the anodic oxide layers 23a is formed across the entire portions extending into the device hole 16 except the contact part 22a which comes in contact with the electrode pad of the semiconductor chip. The anodic oxide layers 23a are formed to encroach on a predetermined part of the inner leads so that predetermined portions of the inner leads become an insulating layer.

Figure 5A:
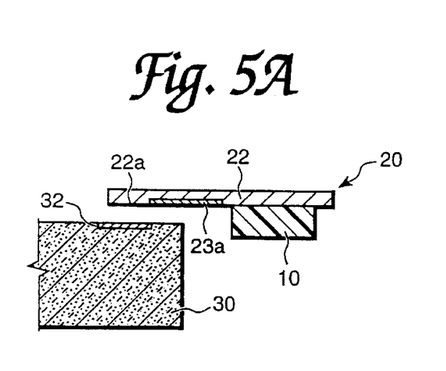
FIGS. 5A and 5B are partially-sectional views of an example for bonding an electrode pad of a semiconductor chip and an inner lead to each other mounted in the film carrier of FIG. 4A.
Figure 5B:
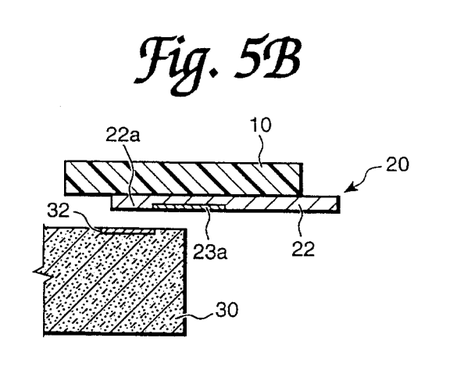

FIGS. 5A and 5B are partially-sectional views showing an example of bonding an electrode pad of a semiconductor chip to an inner lead mounted in the film carrier of FIG. 4A.

FIG. 5A shows lead 20 formed on the upper portion of the insulating film 10, while FIG. 5B shows lead 20 formed on the lower portion of the insulating film 10, which makes no difference in the bonding technique.

Referring to FIGS. 5A and 5B, the contact portion 22a of the inner leads 22 is directly thermo-compressed to the above-mentioned electrode pad 32. At this time, the anodic oxide layer 23a prevents a short-circuit between the inner lead 22 and the edge 8 of the semiconductor chip 30.

The anodic oxidation of the end portions of the inner leads, which are connected to the bonding pads of the semiconductor chip, can prevent the inner leads from being short-circuited together with the edge portions of the semiconductor chip.

Conventionally, leads 20 are made from thin copper or copper alloy film to facilitate the thermo-compression process with aluminum electrode pads disposed between bumps, but they cannot be applied to the present invention since they cannot be anodized. Accordingly, that is why the inner leads 20 are made of unanodizable metals.

Figure 6:
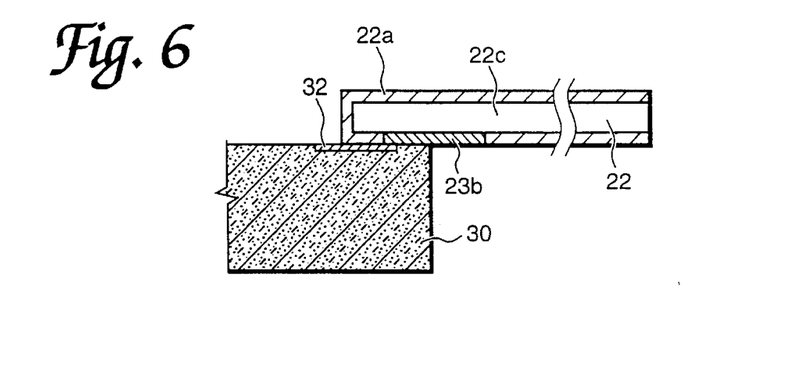
FIG. 6 is a partially-sectional view of the other example for the inner lead of the film carrier in FIG. 4A.

FIG. 6 is a partial-sectional view showing another example for the inner lead of the film carrier in FIG. 4A, and illustrates an embodiment achieved by electroplating an anodizable metal to a predetermined part of the inner leads, in order to use a metallic material that cannot be anodized as the inner lead.

Referring to FIG. 6, an inner lead 22c wholly electroplated by an anodizable metal, is directly bonded to the electrode pad 32 of the semiconductor chip 30. An anodic oxide layer 23b is formed on a predetermined region of the lower portion of the inner lead 22C.

Now, the following description relates to a first preferred embodiment of the method for making the film carrier in accordance with present invention.

First, a device hole 16 and outer lead grooves 14 are formed by punch forming an insulating film 10, and a thin metallic film is then applied across the entire surface to a predetermined thickness. The thin metallic film is formed of a anodizable metal, such as aluminum, tantalum, niobium, zirconium or tungsten.

The thin metallic film has a photo-sensitive layer applied thereto and then exposed to light. The film is then developed to form a pattern of the photo-sensitive layer. By using the pattern of the photo-sensitive layer, the thin metallic film is etched, and the pattern is then removed.

As a result, there are formed a plurality of leads 20 including inner portions or leads 22 and outer portions or leads 24 according to the pattern of the photo-sensitive layer. End portions of the inner leads 22 partially extend into a device hole 16, and the other end portions of the inner leads 22 are electrically connected through trunk leads 18.

Subsequently, an anodic oxide layer 23a is formed on the portions extending into the device hole 16, excluding a contact portion 22a that contacts the electrode pad of the semiconductor chip. The following example describes an embodiment wherein the material of the leads 20 is a thin aluminum film.

After a photo-sensitive layer is applied all across the inner leads 22 except the portions where the anodic oxidation layers 23a will be formed, the portions where the anodic oxide layer 23 is formed in the end portions of the inner leads are defined by an anodizing mask by patterning. The anodizing mask may be used by applying only a photosensitive film, or a dielectric layer may be coated as a mask material and then etched to form a pattern with the photosensitive layer. As described above, since the mask formed of the dielectric layer is reliable at a high anodizing voltage, an improved aluminum pattern may be defined. After the formation of the anodizing mask, anodic oxidation is performed. The customary anodic oxidation method is used, which causes an oxide film to grow on the surface of an electrode by making the electrode act as an anode in an electrolytic bath.

According to the above anodic oxidation process, the trunk lead 18 of the leads 22 having an thin aluminum film are electrically connected to an anode by means of a clamp, and dipped into the electrolytic chamber containing an electrolytic liquid of 3–5% oxalic acid ($H_2C_2O_4$) to connect a power supply between the anodes.

The anodic oxide layer 22a must be formed to encroach upon a predetermined portion of the inner leads in order to insulate just a certain part of the inner leads 22.

Accordingly, if the thickness t1 (see FIG. 4B) of the thin aluminum film is about 10 to 20 μm, the thickness t2 of the anodic oxide layer is about 5 to 7 μm, enough to serve as an insulating layer. The preferable conditions of the anodic oxidation is as follows: temperature 30° C.±2° C.; anodic oxide voltage AC 80 V; current density 3 A/dm$^2$; anodizing time 20 minutes. Higher quality anodic oxide layers 23a can be obtained as the purity of aluminum increases.

As shown in the enlarged sectional view of FIG. 4B, the resultant structure after the anodic oxidation process is the anodic oxide layer 23a formed on the body of the lead 22, and the whole surface of the lead 22 is formed without step. That is because the anodic oxide thin film is able to be anodized on the aluminum.

Accordingly, the end portion of the lead 22 is more strengthened than the conventional lead formed by etching, and thereby prevents the end portion of the lead from being bent during bonding.

As shown in FIG. 6, when a metallic material that cannot be anodized is used as a lead, it can be formed in the same manner as the anodic oxidation process after the additional process of electroplating the surface of the lead 22.

Figure 7A:
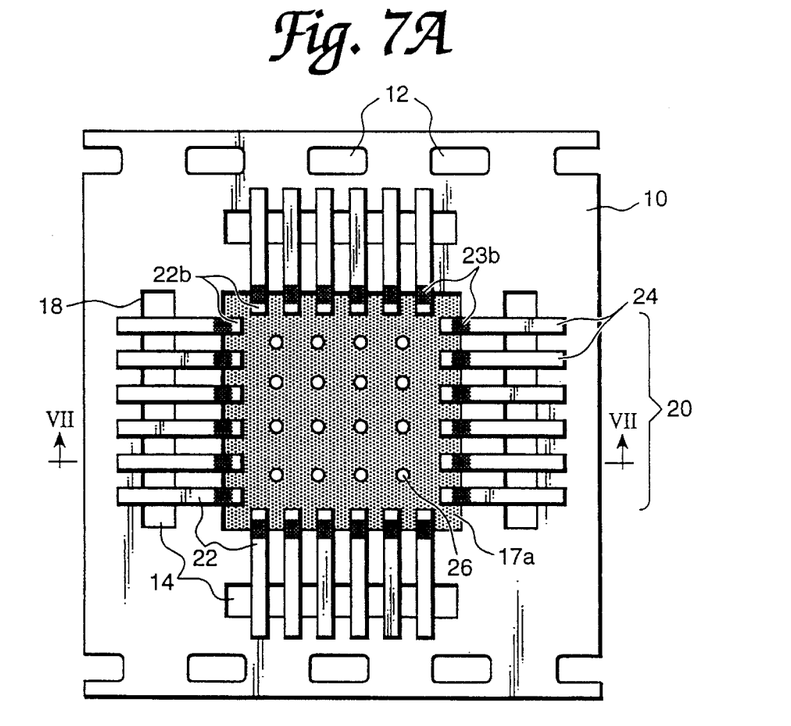
FIG. 7A is a plan view showing a film carrier according to a second preferred embodiment of this invention.
Figure 7B:
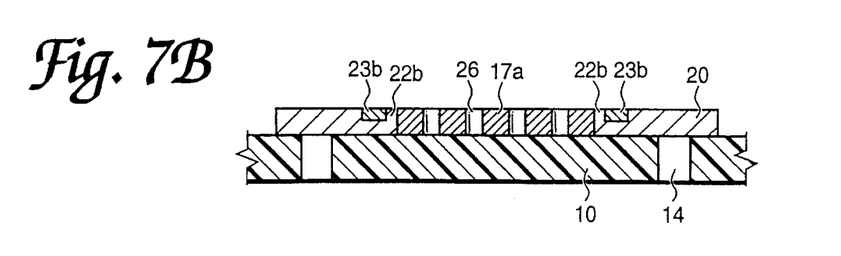
FIG. 7B is a sectional view as taken along line VII—VII of FIG. 7A.

FIG. 7A is a plan view of a second preferred embodiment of the film carrier in accordance with the present invention, and FIG. 7B is a sectional view as taken along line VII—VII of FIG. 7A.

Referring now to FIG. 7A, the film carrier of present embodiment includes an insulating film 10 having sprocket apertures 12, outer lead grooves 14, a plurality of leads 20 including inner lead portions 22 and outer lead portions 24 on the upper or lower surface of the insulating film 10, and a radial metallic material 17a (an anodic oxide pad) which is formed together as a body with the leads 20 and wholly made of an insulator to its bottom by hard anodic oxidation. The anodic oxide pad 17a has the same size as that of the device hole in FIG. 4A, and becomes a hard anodic oxide layer. Contact portions 22b contacting with the electrode pad when bonding the semiconductor chip remain unanodized in the anodic oxide pad 17a.

The film carrier is provided with anodic oxide layers 23b formed on a predetermined area of the inner leads 22 which are electrically connected to the contact portions 22b. The anodic oxide layers 23b are conceptually the same as the anodic oxide layers 23a previously described in the first preferred embodiment. Reference numeral 26 designates a plurality of apertures formed on the anodic oxide pad 17a.

Such a structure is more clearly shown in FIG. 7B, which is a partially enlarged sectional view taken along line VII—VII of FIG. 7A.

Referring to FIG. 7B, the anodic oxide pad 17a is formed on the insulating film 10 having the outer lead grooves 14, and a plurality of leads 20 are formed to be rectangular, corresponding to the anodic oxide pad 17a. The anodic oxide pad 17a is a full insulator in which the thin metallic film including the leads is anodized throughout, and a plurality of apertures 26 are formed therein. The contact portions 22b are electrically connected to the leads 20, and the circumferences of the contact portions 22b are separated form the anodic oxide layers 23b and the anodic oxide pad 17a. The insulating film 10 can be made of polyimide, polyester, polyethersulfonate (PES), or polyparaanic acid (PPA). The leads 20 may be made of easily anodized metal such as aluminum, tantalum, niobium, zirconium or tungsten.

Figure 8:
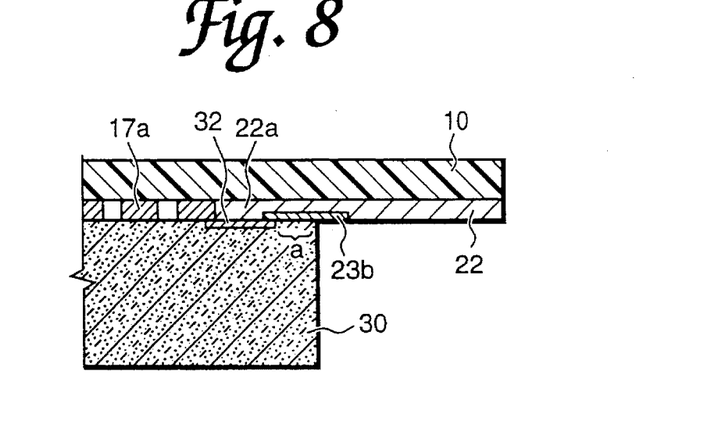
FIG. 8 is a sectional view of an example for bonding an electrode pad of a semiconductor chip and an inner lead to each other mounted in the film carrier of FIG. 7A.

FIG. 8 is a sectional view showing an example for bonding the electrode pad of the semiconductor chip to the inner leads mounted in the film carrier of FIG. 7A.

Referring to FIG. 8, the contact part 22a corresponding to the electrode pad 32 of the semiconductor chip 30 is thermo-compressed directly to the electrode pad 32. The anodic oxide layer 23b covers an edge 8 of the semiconductor chip 30 so as to prevent the inner leads 22 and the edge from short-circuiting. The anodic oxide pad 17a is disposed on the whole top surface of the semiconductor chip 30 and has a plurality of apertures 26, so that the adhesive strength between the semiconductor chip 30 and the whole leads may be enhanced by opening in advance a predetermined region of the insulating film formed on the upper part of the anodic oxide pad 17a and by applying a coating resin to be encapsulated. The opening of the insulating film and coating resin are not shown in the drawing.

A method of making the film carrier according to the second preferred embodiment of present invention is fully described with reference to FIGS. 9A to 9C.

Figure 9A:
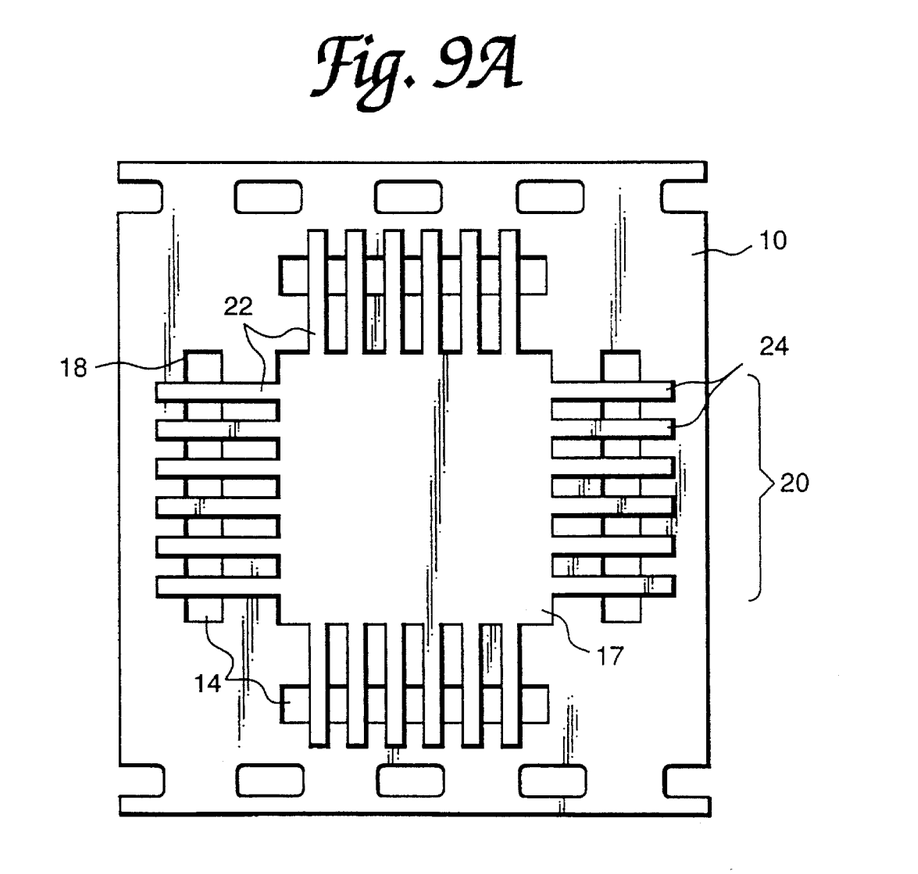
FIGS. 9A to 9C are the steps in the manufacture of the film carrier of FIG. 7A.

Referring now to FIG. 9A, a anodizable material is deposited on an insulating film 10 and patterned to form a metallic pattern 17 of regular square shape and a plurality of leads 20 in a body with the pattern 17.

The plurality of the leads 20 are formed to be symmetrical in every direction to the regular-square shape metallic pattern 17. The leads 20 have inner lead portions 22 and outer lead portions 24. When the square-shaped metallic pattern 17 and leads 20 are patterned, the apertures 26 in FIG. 7 can be formed together. The apertures are not shown in FIG. 9A.

Figure 9B:
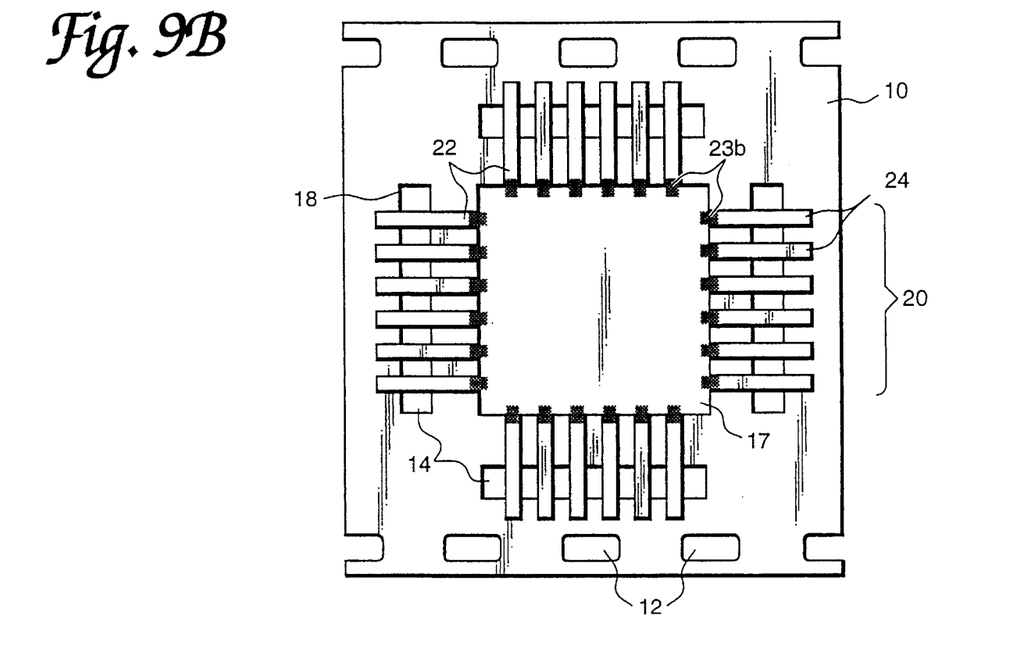
Figure 9C:
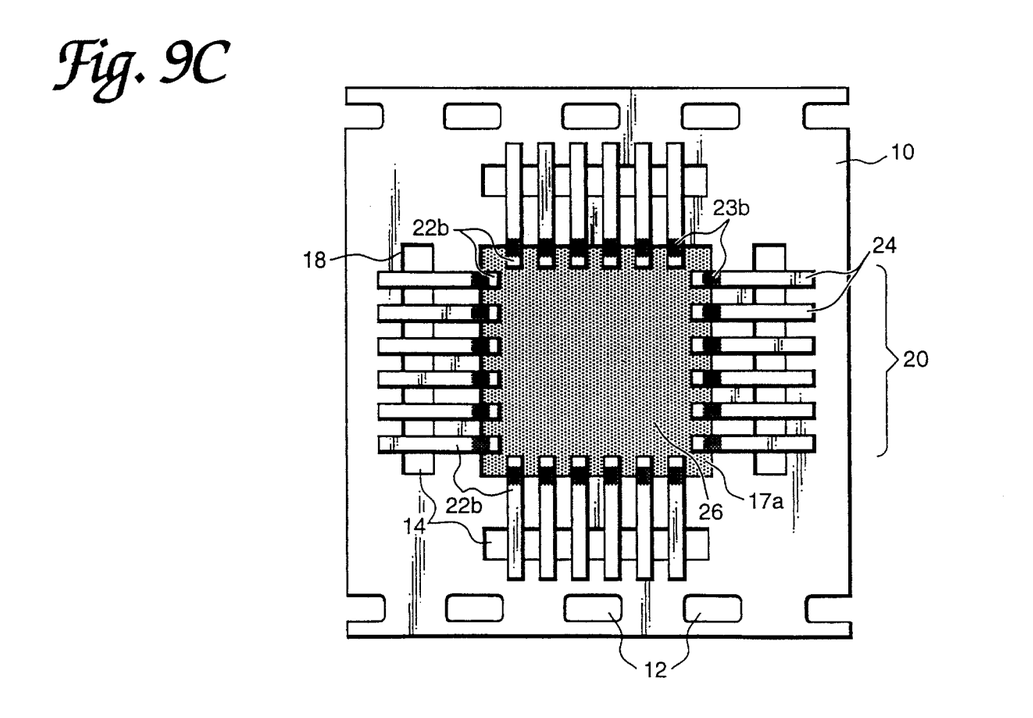

Referring to FIG. 9B, a first anodic oxidation step is performed on one end portion of each inner lead portion 22, which is connected to the metallic pattern 17, to form anodic oxide layer 23b. The processing condition and technique of this anodic oxidation step is basically the same as that in the fabricating method of film carrier in FIG. 4A.

Referring to FIG. 9B, after the anodic oxide layers 23b are formed, a photo-sensitive film is applied all over the leads including the anodic oxide layers 23b on the resultant structure and then patterned to form an anodizing mask defining an area where contact portions will be formed. A second anodic oxidation step is carried out after the above anodizing mask is formed. Here, hard-type anodic oxidation is performed until the metallic pattern 17 becomes a full insulator, unlike the first soft-type anodic oxidation in which just the surface is anodized. The second oxidation, if the thickness of the metallic pattern 17 is about 20 to 40 μm, is carried out for about 80 to 169 minutes in the same manner as first anodic oxidation step to obtain desired anodic oxide layers 23a.

The film carrier manufactured in accordance with this embodiment may have all the advantages as described in the embodiment of FIG. 4A. Moreover, the contact portions 23b contacting the electrode pad of the semiconductor chip to be bonded may be disposed in any part of the rectangular-like metallic pad 17, so that a film carrier can be fabricated in which the leads may be formed without regard to the location of the electrode pad of the semiconductor chip. It is realized by a proper pattern of the anodizing mask.

According to the present invention, production costs may be saved since the film carrier of present invention can be formed just by the anodic oxidation process without the conventional solder bump process and the etching process of the end portions of the leads. Second, the leads may be prevented from being bent during bonding. Third, the device is prevented from being degraded by α-rays since anodized portions protect the active regions of the device. And fourth, the anodic oxide pad having the apertures may enhance the adhesive strength between the semiconductor chip and leads when coating resin is applied.

As a result, the film carrier and the method for manufacturing the same in accordance with present invention may prevent a short-circuit between the inner lead portions and edge portions of the semiconductor chip by electroplating the inner leads with an anodizable metal or by forming anodic oxide layers and then by forming selectively an anodic oxide pad on the region where the semiconductor chip will be mounted.

It is understood that the invention is not limited to the disclosed embodiments and is intended to cover various modifications and equivalent arrangements within the spirit and scope of the invention as defined by the appended claims.

What is claimed is:

1. A film carrier for establishing contact with electrode pads of a semiconductor chip comprising:

a film having a device hold formed therein for mounting said film carrier to the semiconductor chip; and a plurality of conductive leads each including i) a conductive end portion for contacting each of said electrode pads, and ii) an anodic oxide insulator layer disposed adjacent to said conductive end portion for insulating other conductive portions of said lead from said semiconductor chip, said anodic oxide layer being disposed in a recessed portion of said leads.

2. A film carrier according to claim 1, further comprising trunk leads for electrically connecting said plurality of leads to one another.

3. A film carrier according to claim 1, wherein said insulator layer is operable to insulate said leads from edge portions of the semiconductor chip to prevent a short-circuit therebetween.

4. A film carrier according to claim 1, wherein said leads are made of an anodizable metal.

5. A film carrier according to claim 4, wherein said anodizable metal is selected from the group consisting of aluminum, tantalum, niobium, zirconium, tungsten, and their alloys.

6. A film carrier for establishing contact with electrode pads of a semiconductor chip comprising:

a film including at least one sprocket aperture formed in opposite sides thereof, a device hole formed in a central portion thereof, and at least one outer lead groove disposed generally between said at least one sprocket aperture and said device hole;

a plurality of conductive leads formed on the film, said leads each having an insulative layer formed on a predetermined portion thereof;

a pad formed integrally with said plurality of leads, at least one of said pad and leads having a plurality of conductive contact portions adapted to form electrically conductive contact with said electrode pad of the semiconductor chip;

at least one central aperture being formed in said pad; and said pad having at least a portion thereof made from an anodic oxide material.

7. A film carrier according to claim 6, wherein said insulative layer of said leads is operable to prevent a short-circuit between predetermined portions of said leads and edges of said semiconductor chip.

8. A film carrier according to claim 6, wherein said contact portions are formed on said leads and contact the electrode pad of the semiconductor chip.

9. A film carrier according to claim 6, wherein said contact portions are conductive regions formed on said pad, and wherein other portions of said pad comprise a non-conductive anodic oxide material.

10. A film carrier according to claim 6, wherein said plurality of leads are made of an anodizable metal.

11. A film carrier according to claim 6, wherein said anodizable metal is selected from the group consisting of aluminum, tantalum, niobium, zirconium or tungsten, and their alloys.

* * * * *